United States Patent
Sugahara et al.

[11] Patent Number: 5,989,998
[45] Date of Patent: *Nov. 23, 1999

[54] METHOD OF FORMING INTERLAYER INSULATING FILM

[75] Inventors: Gaku Sugahara, Nara; Nobuo Aoi, Hyogo; Koji Arai; Kazuyuki Sawada, both of Osaka, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/919,271

[22] Filed: Aug. 28, 1997

[30] Foreign Application Priority Data

| Aug. 29, 1996 | [JP] | Japan | 8-228112 |
| Oct. 9, 1996 | [JP] | Japan | 8-268571 |
| Feb. 6, 1997 | [JP] | Japan | 9-023522 |

[51] Int. Cl.$^6$ ............................................. H01L 21/4763
[52] U.S. Cl. ........................................... 438/623; 438/743
[58] Field of Search ................................. 438/623, 743, 438/763, 770, 773, 792

[56] References Cited

U.S. PATENT DOCUMENTS

| 3,632,386 | 1/1972 | Hurst | 117/46 |
| 4,123,308 | 10/1978 | Nowlin et al. | 156/272 |
| 4,137,365 | 1/1979 | Wydeven et al. | 428/412 |
| 4,492,733 | 1/1985 | Phillips et al. | 428/412 |
| 4,493,855 | 1/1985 | Sachdev et al. | 427/41 |
| 4,590,117 | 5/1986 | Taniguchi et al. | 350/164 |
| 4,599,243 | 7/1986 | Sachdev et al. | 427/38 |
| 5,112,025 | 5/1992 | Nakayama et al. | |
| 5,252,250 | 10/1993 | Endo et al. | 252/73 |
| 5,270,082 | 12/1993 | Lin et al. | 528/10 |
| 5,298,587 | 3/1994 | Hu et al. | 427/539 |
| 5,429,995 | 4/1995 | Nishiyama et al. | |
| 5,718,967 | 2/1998 | Hu et al. | 428/216 |

FOREIGN PATENT DOCUMENTS

| 0212691 | 10/1986 | European Pat. Off. |
| 0 212 691 | 3/1987 | European Pat. Off. |
| 0 560 617 | 9/1993 | European Pat. Off. |
| 0560617 | 12/1993 | European Pat. Off. |
| 41 26 759 | 2/1993 | Germany |
| 03101123 | 4/1991 | Japan |
| 07254592 | 3/1995 | Japan |
| 08321217 | 3/1996 | Japan |

OTHER PUBLICATIONS

Wiedman et al, "New photodefinable glass etch masks for entirely dry photolithography: Plasma deposited organosilicon hydride polymers", Applied Physics Letters, American Institute of Physics, vol. 62, pp. 372–374, Jan. 25, 1993.

(List continued on next page.)

*Primary Examiner*—John F. Niebling
*Assistant Examiner*—Michael S. Lebentritt
*Attorney, Agent, or Firm*—McDermott, Will & Emery

[57] ABSTRACT

A material containing, as a main component, an organic silicon compound represented by the following general formula:

$$R^1_x Si(OR^2)_{4-x}$$

(where $R^1$ is a phenyl group or a vinyl group; $R^2$ is an alkyl group; and x is an integer of 1 to 3) is caused to undergo plasma polymerization or react with an oxidizing agent to form an interlayer insulating film composed of a silicon oxide film containing an organic component. As the organic silicon compound where $R^1$ is a phenyl group, there can be listed phenyltrimethoxysilane or diphenyldimethoxysilane. As the organic silicon compound where $R^1$ is a vinyl group, there can be listed vinyltrimethoxysilane or divinyldimethoxysilane.

8 Claims, 6 Drawing Sheets

OTHER PUBLICATIONS

K. Endo, et al., "Nitrogen Doped Fluorinated Amorphous Carbon Thin Films Grown by Plasma Enhanced Chemical Vapor Deposition", Extended Abstracts of the 1995 International Conference on Solid State Devices and Materials, Osaka, pp. 177–179, 1995 Month Unknown.

European Search Report dated Jun. 26, 1998.

C. I. Lang, et. al., Vapor Deposition Of Very Low K Polymer Films, Poly (Naphthalene), Poly Fluorinated Naphthalene), Materials Research Society Symposium Proc., vol. 381, Apr. 17–19, 1995, pp. 45–50.

K. Endo, et al., "Fluorinated Amorphous Carbon Thin Films Grown By Helicon Plasma Enhanced Chemical Vapor Deposition For Low Dielectric Constant Interlayer Dielectrics", Applied Physics Letters, vol. 68, No. 20, May 13, 1996, pp. 2864–2866.

F. Durrant, et al., "Fluorine–Containing Amorphous Hydrogenated Carbon Films", Thin Solid Films, vol. 281/282, No. 1/02 Aug. 1, 1996, pp. 294–297.

Endo, et al., "Fluorinated Amorphous Carbon Thin Films Grown By Helicon Plasma Enhanced Chemical Vapor Deposition For Low Dielectric Constant Interlayer Dielectrics" Applied Physics Letters, vol. 68, No. 20, May 13, 1996, pp. 2864–2866.

METHOD OF FORMING INTERLAYER INSULATING FILM

BACKGROUND OF THE INVENTION

The present invention relates to a method of forming an interlayer insulating film in a semiconductor device.

Known interlayer insulating films formed in semiconductor devices include a silicon oxide film, a silicon oxide film composed of an organic SOG (Spin-On-Glass) containing an organic component, and an organic polymer film.

In general, an interlayer insulating film formed in a semiconductor device is required to have a sufficiently low dielectric constant to achieve lower wiring capacitance and sufficiently high heat resistance to withstand a semiconductor manufacturing process.

With the increasing miniaturization of an LSI formed on a semiconductor substrate, wiring capacitance which is parasitic capacitance between metal wires has remarkably increased, while degraded performance of the LSI due to a wiring delay caused thereby has presented a serious problem. The wiring capacitance is determined by the size of a space between the metal wires and by the magnitude of the dielectric constant of an interlayer insulating film present in the space. To reduce the wiring capacitance, therefore, it is important to reduce the dielectric constant of the interlayer insulating film.

If an interlayer insulating film with low heat resistance is used, a thermal treatment at about 400° C. performed in a semiconductor manufacturing process will soften the interlayer insulating film and undulate wiring, which may cause a fatal failure such as a disconnection or short circuit. This is why the interlayer insulating film is required to have sufficiently high heat resistance to withstand the thermal treatment at about 400° C.

Since an interlayer insulating film composed of a silicon oxide film has an undesirably high dielectric constant, there has been proposed a fluorine-doped silicon oxide film made of silicon oxide doped with fluorine. Although the dielectric constant of the fluorine-doped silicon oxide film has been lowered by bonding a fluorine atom having low polarizability to a silicon atom composing the oxide film, the moisture absorbing property thereof increases with an increase in the amount of fluorine added thereto, so that a minimum dielectric constant attainable is about 3.5. Hence, it is difficult to use silicon oxide films including the fluorine-doped silicon oxide film as interlayer insulating films in an extremely miniaturized LSI.

In place of silicon oxide films, the use of an organic SOG film or organic polymer film as an interlayer insulating film in an extremely miniaturized LSI is under consideration because of its low dielectric constant.

The organic SOG film is formed by thermally curing a solution containing silica or siloxane each having an organic component such as a methyl group or a phenyl group. Since the organic component remains in the film even after thermal curing, a low dielectric constant of about 3.0 is attained.

As a first conventional embodiment, a method of forming an interlayer insulating film composed of an organic SOG film will be described with reference to FIGS. 6(a) to 6(d).

First, as shown in FIG. 6(a), first-level metal wires 2 are formed on a semiconductor substrate 1, followed by a first silicon oxide film 3 formed over the entire surface of the semiconductor substrate 1 including the first-level metal wires 2 by plasma CVD using a gas mixture of, e.g., tetraethoxysilane and oxygen as a raw material. Thereafter, an organic SOG agent is applied onto the first silicon oxide film 3 by spin coating and thermally cured to form an organic SOG film 4.

Then, as shown in FIG. 6(b), the entire surface of the organic SOG film 4 is etched back such that the portions thereof overlying the first-level metal wires 2 are removed.

Next, as shown in FIG. 6(c), a second silicon oxide film 5 is formed over the entire surface of the silicon oxide film 3 including the remaining organic SOG film 4 by, e.g., plasma CVD using a gas mixture of, e.g., tetraethoxysilane and oxygen as a raw material.

Next, as shown in FIG. 6(d), contact holes are formed in the first and second silicon oxide films 3 and 5 by using a resist pattern as a mask, which is then removed by using an oxygen plasma. Subsequently, a metal material is filled in the contact holes to form contacts. After that, second-level metal wires 7 are formed on the second silicon oxide film 5, resulting in a structure having an interlayer insulating film consisting of the first silicon oxide film 3, the organic SOG film 4, and the second silicon oxide film 5 between the first- and second-level metal wires 2 and 7.

As a second conventional embodiment, a method of forming an interlayer insulating film composed of a fluorinated amorphous carbon film, which is an organic polymer film, will be described. As disclosed in a technical report (Extended Abstracts of the 1995 International Conference on Solid State Devices and Materials, Osaka, 1995, pp.177–179), a fluorinated amorphous carbon film is formed by plasma CVD using, as a raw material, a mixture of a hydrocarbon-based component such as $CH_4$ and a fluorine-containing component such as $CF_4$.

After the gas mixture is introduced into a reaction chamber of a parallel-plate plasma CVD apparatus, the pressure inside the reaction chamber is held at several hundreds of Torr. When RF power on the order of 100 to 300 W at 13.56 MHz is applied to parallel-plate electrodes in the reaction chamber, the gas mixture is partially decomposed to generate monomers, ions, and radicals, which undergo plasma polymerization, resulting in a fluorinated amorphous carbon film as a plasma polymerization film deposited on a semiconductor substrate. The fluorinated amorphous carbon film thus formed has a low dielectric constant of 2.0 to 2.5 immediately after deposition.

However, since the foregoing organic SOG film is formed by repeatedly performing the steps of applying the organic SOG agent and thermally curing the applied organic SOG agent several times, it has the disadvantages of poor film formability resulting from a large amount of time required by the formation of the organic SOG film and high cost resulting from the major portion of the agent wasted during the spin coating.

In the case where the etch-back process, as illustrated in FIG. 6(b), is not performed with respect to the entire surface of the organic film 4 before contact holes are formed in the organic SOG film 4 and in the first silicon oxide film 3 by using the resist pattern as a mask, which is then removed by using an oxygen plasma, and contacts are formed by filling the metal material in the contact holes, the following problems arise. In the step of removing the resist pattern by using the oxygen plasma, $SiCH_3$ contained in the organic SOG films 4 exposed at the sidewalls of the contact holes reacts with the oxygen plasma to generate SiOH, which is condensed by dehydration to generate $H_2O$ in the step of filling the metal material in the contact holes. The resulting $H_2O$ causes the oxidization and contamination of the metal forming the contacts, leading to faulty conduction at a contact.

As for the organic polymer film composed of the fluorinated amorphous carbon film, it has the advantage of an extremely low dielectric constant over the organic SOG film but is inferior thereto in heat resistance because of its low glass transition temperature. When the conventional fluorinated amorphous carbon film is subjected to a thermal treatment at a temperature of 300° C. or more, the thickness of the film is significantly reduced, while the dielectric constant thereof is greatly increased. For example, if a fluorinated amorphous carbon film made from $CH_4$ and $CF_4$ and having a dielectric constant of 2.2 immediately after deposition is subjected to a thermal treatment at a temperature of 300° C. for 1 hour, the film contracts till the thickness thereof is reduced to about 65% of the original thickness immediately after deposition, which is a 35% reduction, while the dielectric constant thereof is increased to about 2.8.

It is to be noted that the foregoing problems are not limited to the interlayer insulating film formed between upper and lower metallization layers but also arise in an interlayer insulating film between metal wires included in a single metallization layer.

SUMMARY OF THE INVENTION

In view of the foregoing, a first object of the present invention is to improve the film formability, cost efficiency, and processability of an interlayer insulating film composed of an organic SOG film. A second object of the present invention is to improve the heat resistance of an interlayer insulating film composed of an organic polymer film.

To attain the first object, there is provided a first method of forming an interlayer insulating film of the present invention, wherein a material containing, as a main component, an organic silicon compound represented by the following general formula:

$$R^1_x Si(OR^2)_{4-x}$$

(where $R^1$ is a phenyl group or a vinyl group; $R^2$ is an alkyl group; and x is an integer of 1 to 3) is caused to undergo plasma polymerization or react with an oxidizing agent to form an interlayer insulating film composed of a silicon oxide film containing an organic component.

In accordance with the first method of forming an interlayer insulating film, since the resulting interlayer insulating film contains, as a main component, the organic silicon compound represented by the following general formula:

$$R^1_x Si(OR^2)_{4-x}$$

(where $R^1$ is a phenyl group or a vinyl group; $R^2$ is an alkyl group; and x is an integer of 1 to 3) or by the following general formula:

$$R^1_x SiH_{4-x}$$

(where $R^1$ is a phenyl group or a vinyl group; and x is an integer of 1 to 3), the proportion of $SiCH_3$ contained in the interlayer insulating film is much lower than contained in a conventional organic SOG film, though the dielectric constant thereof is equal to that of the conventional organic SOG film. Accordingly, even when the interlayer insulating film is exposed to an oxygen plasma, only a small amount of SiOH is generated and the dehydration condensation of SiOH does not occur in the step of filling a metal material in contact holes. As a result, $H_2O$ is not generated and hence the problem of faulty conduction at a contact does not occur.

Moreover, since the silicon oxide film containing the organic component is formed by causing the material containing the organic silicon compound as the main component to undergo plasma polymerization or react with an oxidizing agent in accordance with the first method of forming an interlayer insulating film, it is no more necessary to perform the steps of applying an organic SOG agent and curing the applied organic SOG agent, resulting in excellent film formability.

In the first method of forming an interlayer insulating film, the organic silicon compound represented by the general formula: $R^1_x Si(OR^2)_{4-x}$ is preferably phenyltrimethoxysilane or diphenyldimethoxysilane and the organic silicon compound represented by the general formula: $R^1_x SiH_{4-x}$ is preferably phenylsilane or diphenylsilane.

In the first method of forming an interlayer insulating film, the organic silicon compound represented by the general formula: $R^1_x Si(OR^2)_{4-x}$ is preferably vinyltrimethoxysilane or divinyldimethoxysilane and the organic silicon compound represented by the general formula: $R^1_x SiH_{4-x}$ is preferably vinylsilane or divinylsilane.

To attain the second object, there is provided a second method of forming an interlayer insulating film according to the present invention, wherein a material containing, as a main component, a fluorinated carbon compound having two or more double bonds of carbon atoms in a molecule thereof is caused to undergo plasma polymerization to form an interlayer insulating film composed of a fluorinated amorphous carbon film.

In accordance with the second method of forming an interlayer insulating film, since the fluorinated carbon compound has two or more double bonds of carbon atoms in a molecule thereof, radicals each having three or more unoccupied bonds are likely to be generated when the fluorinated carbon compound is decomposed by a plasma. These radicals promote three-dimensional polymerization and ensure three-dimensional bonding in polymer composing the plasma polymerization film, which positively increases the crosslinking density and glass transition temperature of the resulting interlayer insulating film, so that the heat resistance thereof is remarkably improved.

In the second method of forming an interlayer insulating film, the fluorinated carbon compound is preferably composed only of carbon atoms and fluorine atoms. This prevents the plasma polymerization film from containing hydrogen, so that the dielectric constant of the resulting interlayer insulating film is lowered.

In this case, the fluorinated carbon compound is more preferably hexafluoro-1,3-butadiene.

To attain the second object, there is provided a third method of forming an interlayer insulating film according to the present invention, wherein a material containing, as a main component, a fluorinated carbon compound having a triple bond of carbon atoms in a molecule thereof is caused to undergo plasma polymerization to form an interlayer insulating film composed of a fluorinated amorphous carbon film.

In accordance with the third method of forming an interlayer insulating film, since the fluorinated carbon compound has a triple bond of carbon atoms in a molecule thereof, radicals each having three or more unoccupied bonds are likely to be generated when the fluorinated carbon compound is decomposed by a plasma. These radicals promote three-dimensional polymerization and ensure three-dimensional bonding in polymer composing the plasma polymerization film, which positively increases the crosslinking density and glass transition temperature of the resulting interlayer insulating film, so that the heat resistance thereof is remarkably improved.

In the third method of forming an interlayer insulating film, the fluorinated carbon compound is preferably composed only of carbon atoms and fluorine atoms. This prevents the plasma polymerization film from containing hydrogen, so that the dielectric constant of the resulting interlayer insulating film is lowered.

In this case, the fluorinated carbon compound is more preferably hexafluoro-2-butyne.

To attain the second object, there is provided a fourth method of forming an interlayer insulating film according to the present invention, wherein a material containing, as a main component, a fluorinated carbon compound having a polycyclic structure in a molecule thereof is caused to undergo plasma polymerization to form an interlayer insulating film composed of a fluorinated amorphous carbon film.

In accordance with the fourth method of forming an interlayer insulating film, since the fluorinated carbon compound has a polycyclic structure in a molecule thereof, radicals each having three or more unoccupied bonds are likely to be generated when the fluorinated carbon compound is decomposed by a plasma. These radicals promote three-dimensional polymerization and ensure three-dimensional bonding in polymer composing the plasma polymerization film, which positively increases the crosslinking density and glass transition temperature of the resulting interlayer insulating film, so that the heat resistance thereof is remarkably improved.

In the fourth method of forming an interlayer insulating film, the fluorinated carbon compound is preferably composed only of carbon atoms and fluorine atoms. This prevents the plasma polymerization film from containing hydrogen, so that the dielectric constant of the resulting interlayer insulating film is lowered.

In the fourth method of forming an interlayer insulating film, the fluorinated carbon compound preferably has a condensed cyclic structure in the molecule thereof. This increases the likelihood that radicals each having three or more unoccupied bonds are generated, so that the crosslinking density of the resulting interlayer insulating film is further increased, resulting in higher heat resistance thereof.

In this case, the fluorinated carbon compound is more preferably perfluorodecalin, perfluorofluorene, or perfluoro(tetradecahydrophenanthrene).

In a fifth method of forming an interlayer insulating film according to the present invention, a material containing, as a main component, a gas mixture of an organic silicon compound composed of a compound represented by the following general formula:

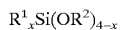

(where $R^1$ is a phenyl group or a vinyl group; $R^2$ is an alkyl group; and x is an integer of 1 to 3) or of a siloxane derivative and a fluorinated carbon compound is caused to undergo plasma polymerization or react with an oxidizing agent to form an interlayer insulating film composed of a silicon oxide film containing a fluorinated carbon.

In accordance with the fifth method of forming an interlayer insulating film, the silicon oxide film containing a fluorinated carbon is formed by causing the material containing, as the main components, the organic silicon compound and the fluorinated carbon compound to undergo plasma polymerization or react with the oxidizing agent so that the resulting interlayer insulating film contains the organic silicon compound and the fluorinated carbon compound, which significantly lowers the dielectric constant of the interlayer insulating film. Moreover, since the steps of applying the organic SOG agent and curing the applied organic SOG agent, which have been necessary to form the conventional organic SOG film, are no more necessary, similarly to the first method of forming an interlayer insulating film, excellent film formability is achieved.

In a sixth method of forming an interlayer insulating film according to the present invention, a material containing, as a main component, a gas mixture of an organic silicon compound and a fluorinated carbon compound having two or more double bonds of carbon atoms in a molecule thereof is caused to undergo plasma polymerization or react with an oxidizing agent to form an interlayer insulating film composed of a silicon oxide film containing a fluorinated carbon.

In accordance with the sixth method of forming an interlayer insulating film, the silicon oxide film containing a fluorinated carbon is formed by causing the material containing, as the main component, the gas mixture of the organic silicon compound and the fluorinated carbon compound to undergo plasma polymerization or react with the oxidizing agent, so that the resulting interlayer insulating film contains the organic silicon compound and the fluorinated carbon compound, which significantly lowers the dielectric constant of the interlayer insulating film. Moreover, since the fluorinated carbon compound has two or more double bonds of carbon atoms in a molecule thereof, similarly to the second method of forming an interlayer insulating film, radicals each having three or more unoccupied bonds are likely to be generated when the fluorinated carbon compound is decomposed by a plasma. These radicals promote three-dimensional polymerization and allow the formation of a silicon oxide film containing a fluorinated carbon with a high crosslinking density and excellent heat resistance.

In a seventh method of forming an interlayer insulating film according to the present invention, a material containing, as a main component, a gas mixture of an organic silicon compound and a fluorinated carbon compound having a triple bond of carbon atoms in a molecule thereof is caused to undergo plasma polymerization or react with an oxidizing agent to form an interlayer insulating film composed of a silicon oxide film containing a fluorinated carbon.

In accordance with the seventh method of forming an interlayer insulating film, the silicon oxide film containing a fluorinated carbon is formed by causing the material containing, as the main component, the gas mixture of the organic silicon compound and the fluorinated carbon compound to undergo plasma polymerization or react with the oxidizing agent, so that the resulting interlayer insulating film contains the organic silicon compound and the fluorinated carbon compound, which significantly lowers the dielectric constant of the interlayer insulating film. Moreover, since the fluorinated carbon compound has a triple bond of carbon atoms in a molecule thereof, similarly to the third method of forming an interlayer insulating film, radicals each having three or more unoccupied bonds are likely to be generated when the fluorinated carbon compound is decomposed by a plasma. These radicals promote three-dimensional polymerization and allow the formation of a silicon oxide film containing a fluorinated carbon with a high crosslinking density and excellent heat resistance.

In an eighth method of forming an interlayer insulating film according to the present invention, a material containing, as a main component, a gas mixture of an organic silicon compound and a fluorinated carbon compound having a polycyclic structure is caused to undergo plasma polymerization or react with an oxidizing agent to form an interlayer insulating film composed of a silicon oxide film containing a fluorinated carbon.

In accordance with the eighth method of forming an interlayer insulating film, the silicon oxide film containing a fluorinated carbon is formed by causing the material containing, as the main component, the gas mixture of the organic silicon compound and the fluorinated carbon compound to undergo plasma polymerization or react with the oxidizing agent, so that the resulting interlayer insulating film contains the organic silicon compound and the fluorinated carbon compound, which significantly lowers the dielectric constant of the interlayer insulating film. Moreover, since the fluorinated carbon compound has a polycyclic structure in a molecule thereof, similarly to the fourth method of forming an interlayer insulating film, radicals each having three or more unoccupied bonds are likely to be generated when the fluorinated carbon compound is decomposed by a plasma. These radicals promote three-dimensional polymerization and allow the formation of a silicon oxide film containing a fluorinated carbon with a high crosslinking density and excellent heat resistance.

In the sixth to eighth methods of forming an interlayer insulating film, the organic silicon compound is composed of a compound represented by the following general formula:

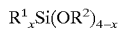

(where $R^1$ is a phenyl group or a vinyl group; $R^2$ is an alkyl group; and x is an integer of 1 to 3) or of a siloxane derivative. This improves the film formability, dielectric constant, and heat resistance of the resulting interlayer insulating film.

DETAILED DESCRIPTION OF THE INVENTION

Figure 1:
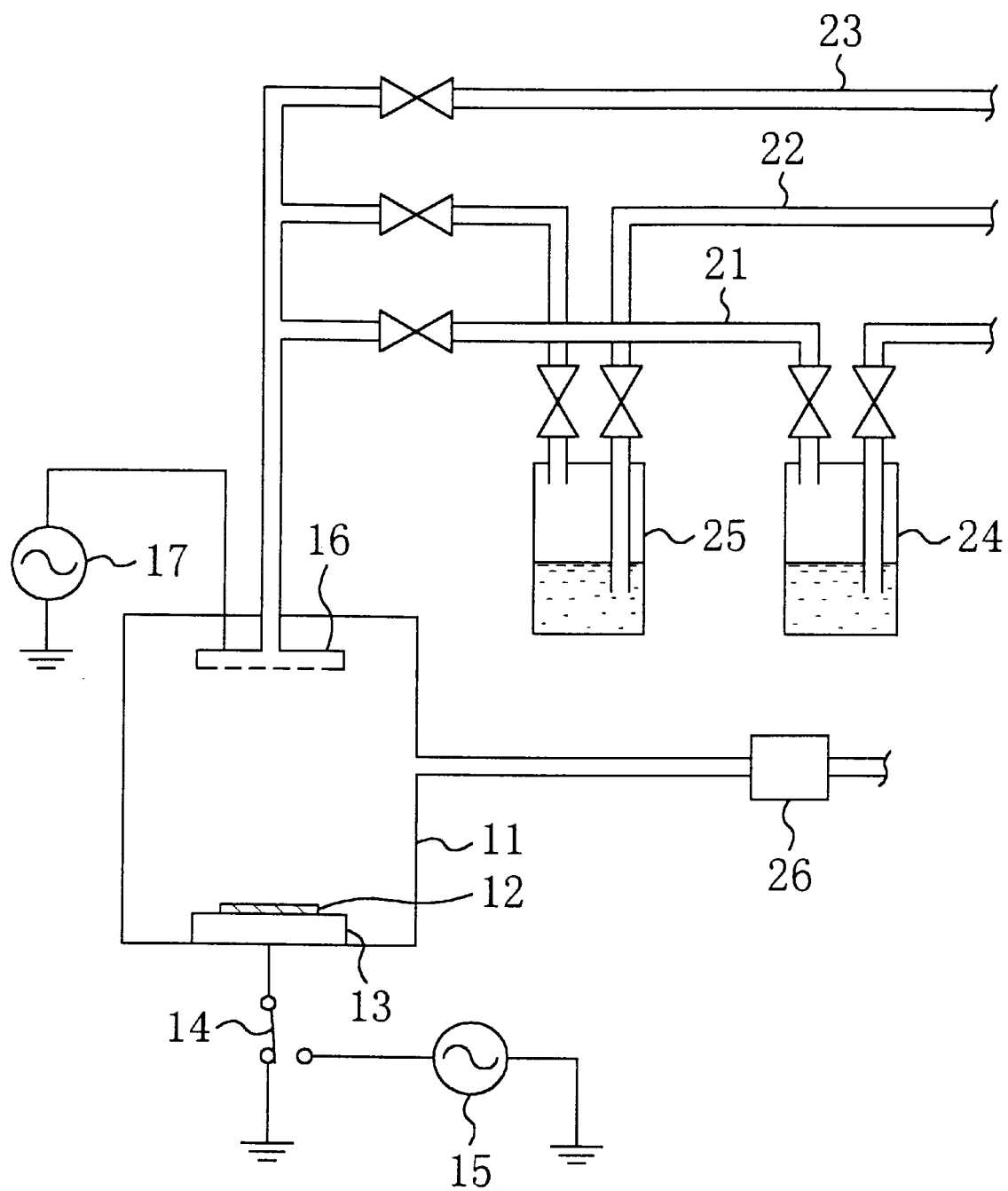
FIG. 1 is a schematic view of a plasma CVD apparatus for use in a method of forming an interlayer insulating film according to each of the embodiments of the present invention.

Referring now to FIG. 1, a description will be given first to a CVD apparatus for use in a method of forming an interlayer insulating film according to each of the embodiments of the present invention, which will be described later.

FIG. 1 schematically shows the structure of a parallel-plate plasma CVD apparatus. As shown in the drawing, a semiconductor substrate 12 made of silicon and a sample stage 13, which is to serve as a lower electrode, are disposed in a hermetic reaction chamber 11. The sample stage 13 is connected to a first RF power source 15 or to the ground via a change-over switch 14. The sample stage 13 is internally provided with a heater (not shown) for heating the semiconductor substrate 12 placed on the sample stage 13 to a specified temperature. In a position opposing the sample stage 13 in the reaction chamber 11, there is provided a shower head 16, which is to serve as an upper electrode. The shower head 16 is connected to a second RF power source 17 for supplying RF power at 13.56 MHz.

The reaction chamber 11 is provided with first, second, and third gas supply lines 21, 22, and 23 for introducing a gas into the reaction chamber 11. The first gas supply line 21 is provided with a first container 24 for containing a liquid raw material therein. When the first container 24 is supplied with carrier gas at a flow rate controlled by a mass flow controller (not shown), the bubbled gas is introduced from the first container 24 into the reaction chamber 11. The second gas supply line 22 is provided with a second container 25 for containing a liquid raw material therein. When the second container 25 is supplied with carrier gas at a flow rate controlled by a mass flow controller (not shown), the bubbled gas is introduced from the second container 25 into the reaction chamber 11. Since the reaction chamber 11 is connected to a vacuum pump 26, the reaction chamber 11 can be evacuated by driving the vacuum pump 26 so that the gases are exhausted from the reaction chamber 11.

Below, a first method of manufacturing a semiconductor device to which the method of forming an interlayer insulating film according to each of the embodiments of the present invention is applied will be described with reference to FIGS. 2(a) to 2(d).

Figure 2A:
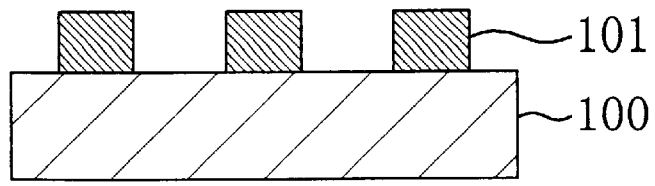
FIGS. 2(a) to 2(d) are cross-sectional views illustrating individual process steps in accordance with a first method of manufacturing a semiconductor device to which the method of forming an interlayer insulating film according to each of the embodiments of the present invention is applied.
Figure 2B:
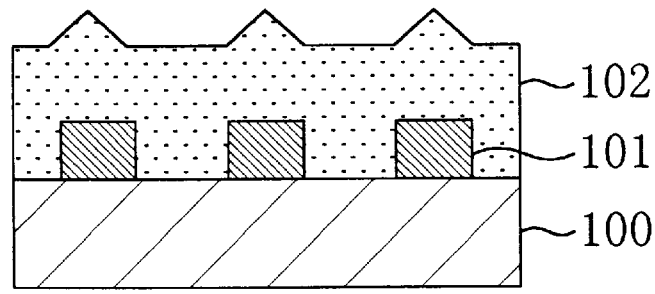

First, as shown in FIG. 2(a), first metal wires 101 made of, e.g., aluminum are formed on a semiconductor substrate 100. Then, as shown in FIG. 2(b), an interlayer insulating film 102 is deposited over the semiconductor substrate 100 including the first metal wires 101. As for a method of forming the interlayer insulating film 102, it will be described later.

Figure 2C:
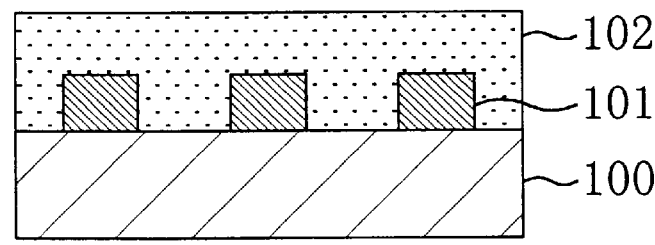
Figure 2D:
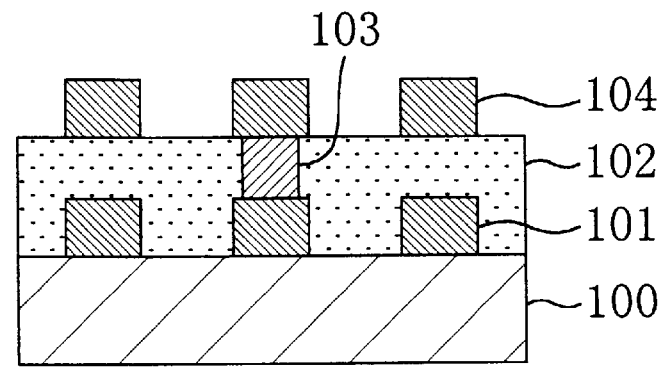

Next, as shown in FIG. 2(c), the interlayer insulating film 102 is subjected to planarization. Thereafter, as shown in FIG. 2(d), a contact 103 is formed in the interlayer insulating film 102, followed by second metal wires 104 made of, e.g., aluminum which are formed on the interlayer insulating film 102.

Below, a second method of manufacturing a semiconductor device to which the method of forming an interlayer insulating film according to each of the embodiments of the present invention will be described with reference to FIGS. 3(a) to 3(d).

Figure 3A:
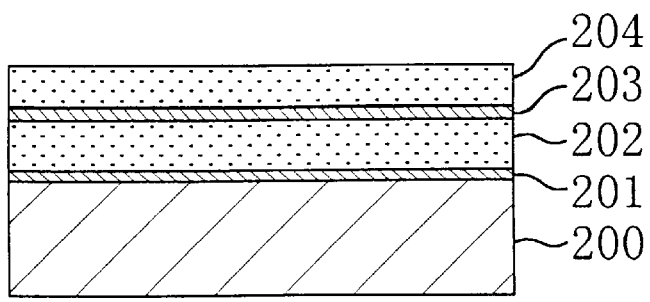
FIGS. 3(a) to 3(d) are cross-sectional views illustrating individual process steps in accordance with a second method of manufacturing a semiconductor device to which the method of forming an interlayer insulating film according to each of the embodiments of the present invention is applied.

First, as shown in FIG. 3(a), a first silicon nitride film 201, a first interlayer insulating film 202, a second silicon nitride film 203, and a second interlayer insulating film 204 are sequentially deposited on a semiconductor substrate 200. As for a method of forming the first and second interlayer insulating films 202 and 204, it will be described later.

Figure 3B:
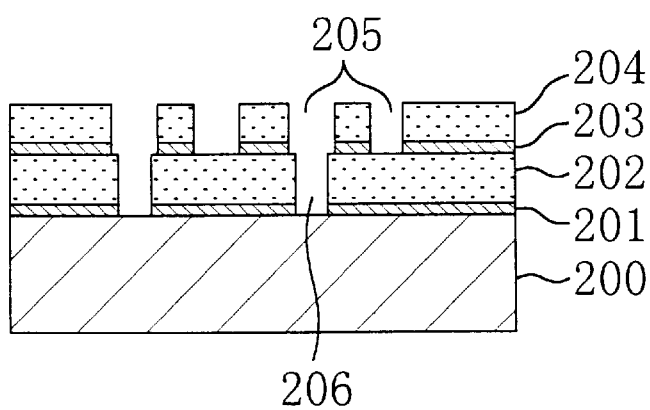

Next, as shown in FIG. 3(b), the second silicon nitride film 203 and the second interlayer insulating film 204 are patterned by photolithography to form openings 205 for forming a wiring pattern. Then, the first silicon nitride film 201 and the first interlayer insulating film 202 are patterned by photolithography to form openings for contacts. In this case, the second silicon nitride film 203 serves as an etching stopper against etching performed with respect to the second interlayer insulating film 204, while the first silicon nitride film 201 serves as an etching stopper against etching performed with respect to the first interlayer insulating film 202.

Figure 3C:
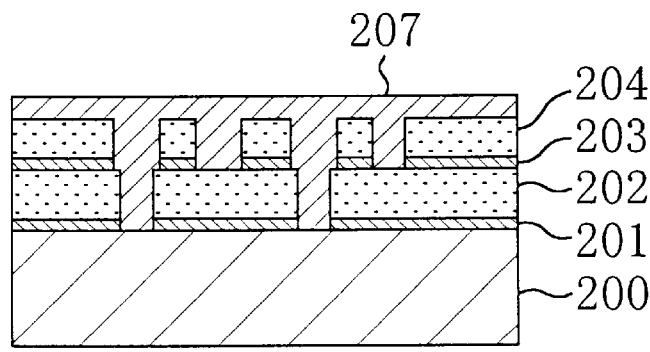

Next, as shown in FIG. 3(c), a metal film 207 made of, e.g., copper is deposited over the entire surface of the semiconductor substrate 200 by sputtering or CVD and caused to reflow by a thermal treatment to be filled in the openings 205 for forming a wiring pattern and in the openings 206 for contacts.

Figure 3D:
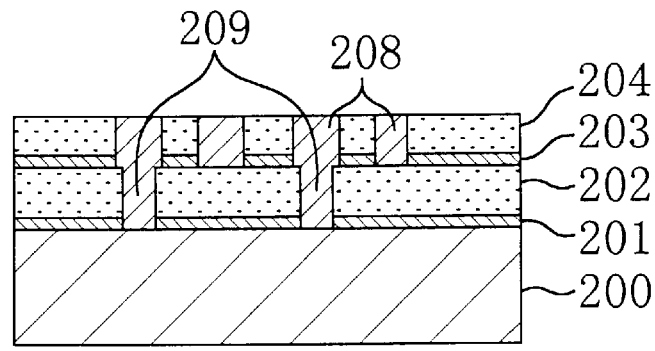

The metal film 207 is then subjected to CMP to form metal wires 208 and contacts 209 as shown in FIG. 3(d), resulting in buried wiring having a dual damascene structure.

(First Embodiment)

An interlayer insulating film according to a first embodiment is a plasma polymerization film formed by inducing plasma polymerization of a material containing, as a main component, phenyltrimethoxysilane which is an organic silicon compound represented by the following general formula:

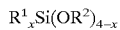

(where $R^1$ is a phenyl group or a vinyl group; $R^2$ is an alkyl group; and x is an integer of 1 to 3).

A description will be given to a method of forming the interlayer insulating film according to the first embodiment.

First, the semiconductor substrate 12 is placed on the sample stage 13 heated to, e.g., 400° C. and grounded by the change-over switch 14 and then the reaction chamber 11 is evacuated by the vacuum pump 26.

Next, phenyltrimethoxysilane represented by the following Chemical Formula 1:

Chemical Formula 1

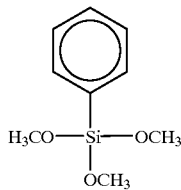

is contained in the first container 24, while carrier gas composed of, e.g., argon is supplied at a flow rate of 480 cc/min to the first container 24 so that bubbled phenyltrimethoxysilane is introduced into the reaction chamber 11.

Next, the pressure inside the reaction chamber 11 is set to about 1.0 Torr and RF power of 250 W at a frequency of 13.56 MHz is applied from the second RF power source 17 to the shower head 16 serving as the upper electrode. During the process, phenyltrimethoxysilane gas is partially decomposed to generate monomers, ions, and radicals as decomposition products, which are polymerized to form the interlayer insulating film made of the plasma polymerization film on the semiconductor substrate 12. The structure of the plasma polymerization film is diagrammatically shown by the following Chemical Formula 2:

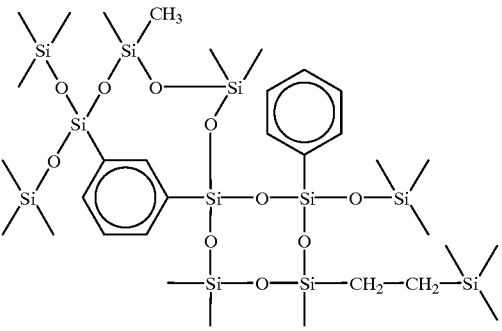

Chemical Formula 2

Since the interlayer insulating film according to the first embodiment is formed by plasma CVD, it is unnecessary to repeatedly perform the steps of applying the organic SOG agent and thermally curing the applied SOG agent several times, resulting in improved film formability and lower cost.

In addition, since the interlayer insulating film according to the first embodiment contains $SiCH_3$ in an amount much smaller than in the conventional organic SOG film, a minimum amount of SiOH is generated even when the interlayer insulating film is etched by using an oxygen plasma. Consequently, the step of filling metal in contact holes is free from the phenomenon that SiOH is condensed by dehydration to generate $H_2O$ and cause faulty conduction at a contact.

Figure 4:
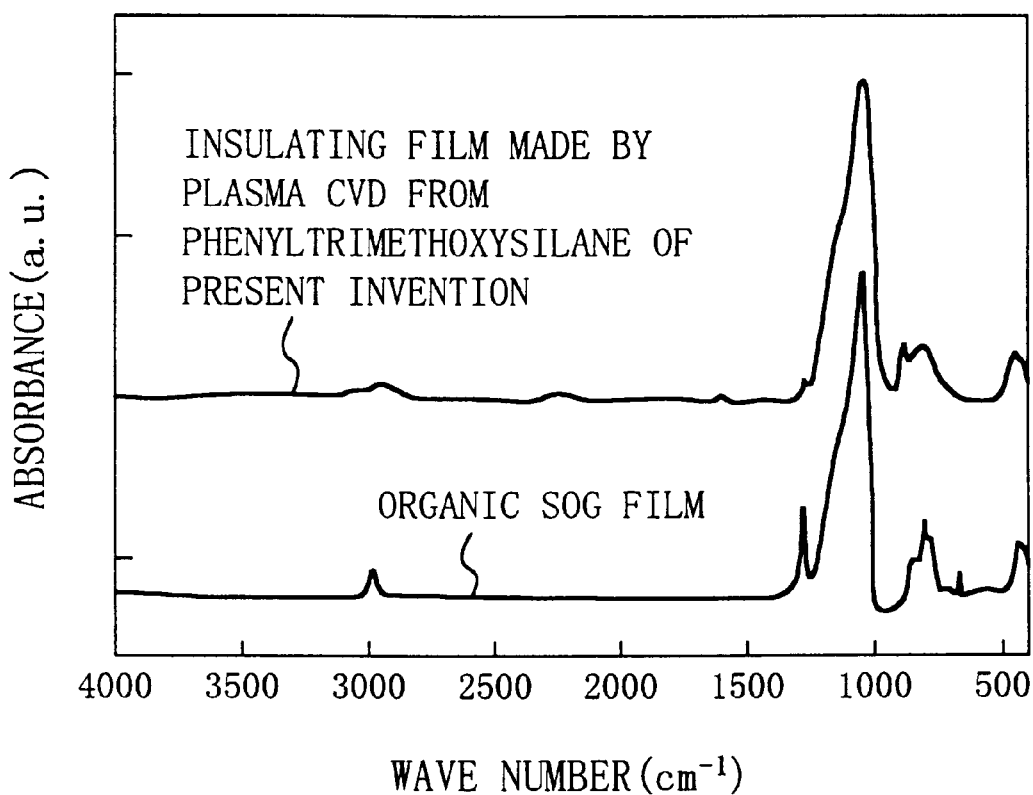
FIG. 4 shows the result of analysis when Fourier transform infrared spectroscopy was performed with respect to an interlayer insulating film according to the first embodiment and a conventional organic SOG film.

FIG. 4 shows the result of analysis when Fourier transform infrared spectroscopy (hereinafter referred to as FT-IR) was performed with respect to the interlayer insulating film according to the first embodiment and to the conventional organic SOG film. In contrast to the spectrum obtained from the conventional organic SOG film which exhibits a distinct peak of absorbance in the vicinity of a wave number of 1300 $cm^{-1}$, the spectrum obtained from the interlayer insulating film according to the first embodiment exhibits only a small peak of absorbance in the vicinity of a wave number of 1300 $cm^{-1}$, which indicates that the interlayer insulating film according to the first embodiment contains a smaller amount of $SiCH_3$ than the conventional organic SOG film.

Figure 5:
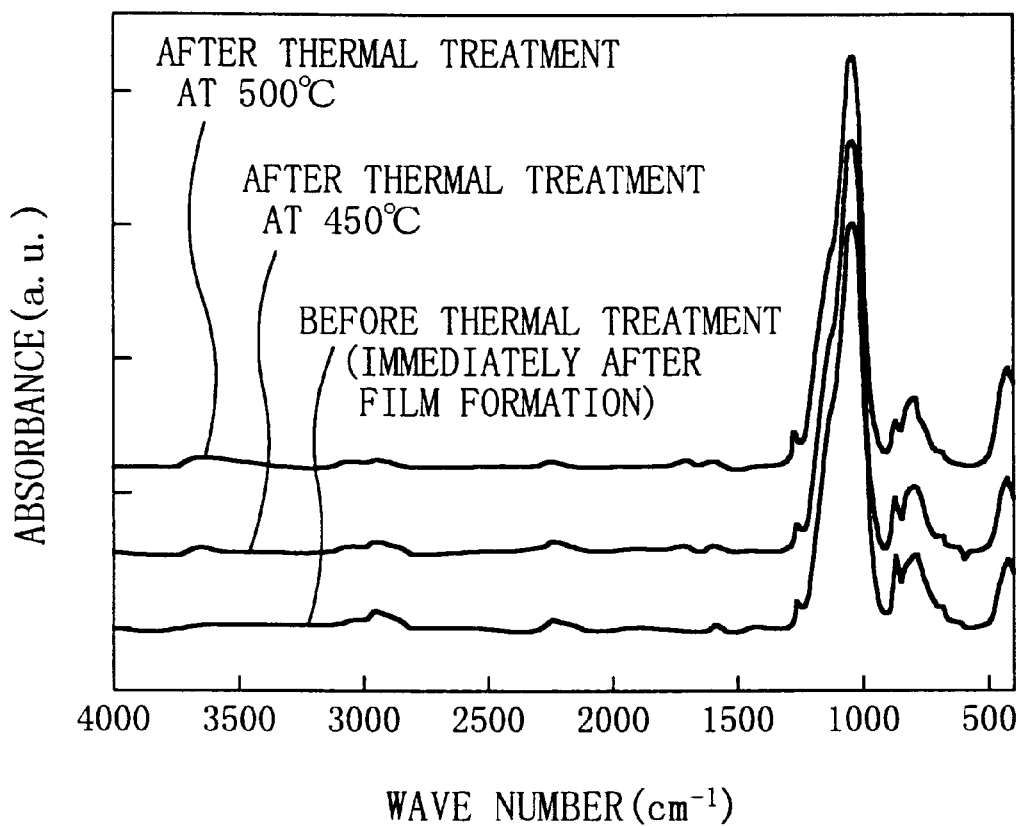
FIG. 5 shows the result of analysis when Fourier transform infrared spectroscopy was performed with respect to interlayer insulating films according to the first embodiment, which had undergone no thermal treatment, a thermal treatment at 450° C., and a thermal treatment at 500° C.
Figure 6A:
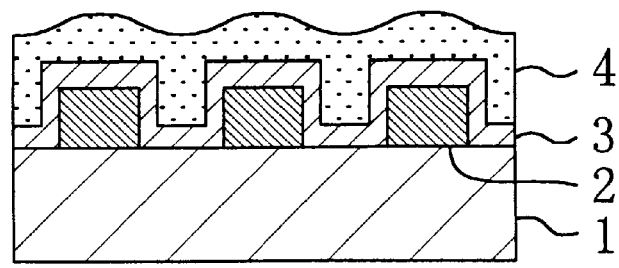
FIGS. 6(a) to 6(d) are cross-sectional views illustrating individual process steps in accordance with a conventional method of forming an interlayer insulating film.
Figure 6B:
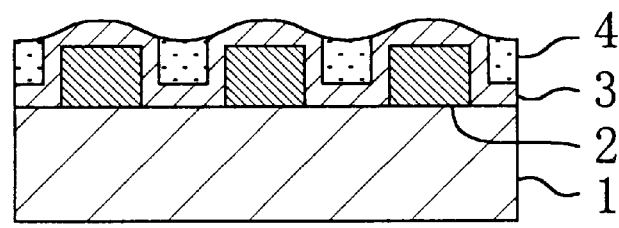
Figure 6C:
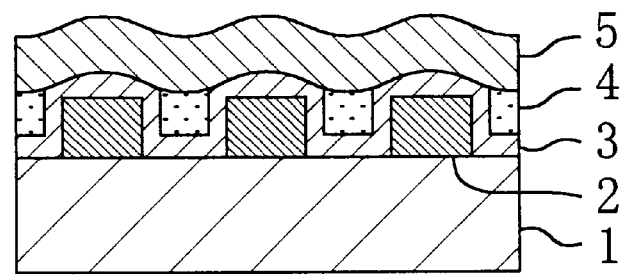
Figure 6D:
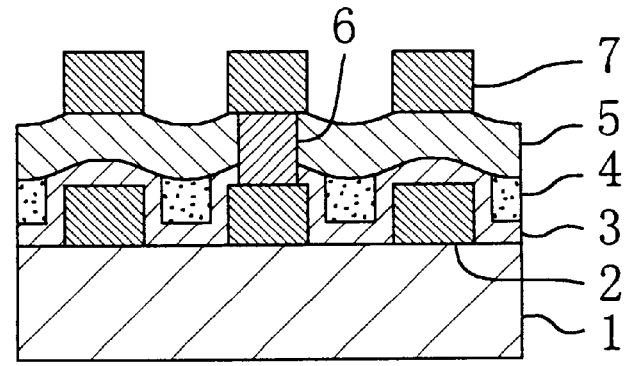

FIG. 5 shows the result of analysis when FT-IR was performed with respect to interlayer insulating films which had undergone no thermal treatment, a thermal treatment at 450° C. in a nitrogen atmosphere, and a thermal treatment at 500° C. in a nitrogen atmosphere. Since no difference is observed between the FT-IR spectra obtained from the interlayer insulating films with no thermal treatment and with the thermal treatments at 450° C. and 500° C., it will be understood that the interlayer insulating film according to the first embodiment has sufficiently high heat resistance to withstand an LSI manufacturing process.

The dielectric constant of the interlayer insulating film according to the first embodiment was about 3.0. After the interlayer insulating film was allowed to stand at room temperature for about 2 weeks, the dielectric constant thereof was measured again to be about 3.1. This indicates that the interlayer insulating film according to the first embodiment has stable film quality scarcely varying with time.

The density of leakage currents was also measured to be about $4.5 \times 10^{-8}$ $A/cm^2$ at 5 MV/cm, which was satisfactory.

Although the pressure inside the reaction chamber 11 has been set to about 1.0 Torr, it is not limited thereto but may be set at any value within the range of 100 mTorr to 20 Torr. More preferably, the pressure inside the reaction chamber 11 is within the range of 0.5 to 5.0 Torr.

Although the semiconductor substrate 12 has been heated to 400° C., it is not limited thereto but may be heated to any temperature within the range of 25 to 500° C. If the semiconductor substrate 12 is heated to a temperature over 400° C., however, aluminum composing the metal wires formed on the semiconductor substrate 12 will lose heat resistance, so that the semiconductor substrate 12 is preferably heated to a temperature equal to or lower than 400° C. If the temperature of the semiconductor substrate 12 is less than 200° C., on the other hand, an undesired component may be contained in the interlayer insulating film being formed, so that the semiconductor substrate 12 is preferably heated to a temperature of 200° C. or more.

The RF power applied to the shower head 16 as the upper electrode may have any value within the range of 100 to 1000 W. More preferably, the RF power has a value within the range of 250 to 500 W.

As compounds represented by the foregoing general formula: $R^1_x Si(OR^2)_{4-x}$ where $R^1$ is a phenyl group, there can be listed diphenyldimethoxysilane ($Ph_2$—Si—$(OCH_3)_2$) in addition to phenyltrimethoxysilane. As compounds represented by the foregoing general formula: $R^1_x Si(OR^2)_{4-x}$ where $R^1$ is a vinyl group, there can be listed vinyltrimethoxysilane ($CH_2$=CH—Si—$(OCH_3)_3$) and divinyldimethoxysilane (($CH_2$=CH$)_2$—Si—$(OCH_3)_2$).

Although the first embodiment has formed the interlayer insulating film composed of the plasma polymerization film by causing the material having, as a main component, an organic silicon compound represented by the general formula:

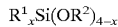
$$R^1_x Si(OR^2)_{4-x}$$

to undergo plasma polymerization, the interlayer insulating film may also be formed by causing the material having, as a main component, an organic silicon compound represented by the following general formula:

$$R^1_x SiH_{4-x}$$

(where $R^1$ is a phenyl group or a vinyl group; and x is an integer of 1 to 3) to undergo plasma polymerization or by causing the material having, as a main component, an organic silicon compound represented by the forgoing general formula:

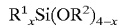
$$R^1_x Si(OR^2)_{4-x}$$

or by the foregoing general formula:

$$R^1_x SiH_{4-x}$$

to react with an oxidizing agent made of, e.g., $O_2$ or $H_2O$. In this case, $O_2$ gas, $H_2O$ gas, or the like is introduced into the reaction chamber 11 through the third gas supply line 23 in the CVD apparatus shown in FIG. 1.

As compounds represented by the foregoing general formula: $R^1_x SiH_{4-x}$ where $R_1$ is a phenyl group, there can be listed phenylsilane and diphenylsilane. As compounds represented by the foregoing general formula: $R^1_x SiH_{4-x}$ where $R_1$ is a vinyl group, there can be listed vinylsilane or divinylsilane.

(Second Embodiment)

An interlayer insulating film according to a second embodiment is a fluorinated amorphous carbon film formed by inducing plasma polymerization of a material having, as a main component, 1,1,1,3,3-pentafluorpropene which is a fluorinated carbon compound having a double bond of carbon atoms in a molecule thereof and containing a hydrogen atom.

A description will be given to a method of forming the interlayer insulating film according to the second embodiment.

First, the semiconductor substrate 12 is placed on the sample stage 13 grounded by the change-over switch 14 and then the reaction chamber 11 is evacuated by the vacuum pump 26.

Next, 1,1,1,3,3-pentafluoropropene is contained in the first container 24, while carrier gas composed of, e.g., argon is supplied at a flow rate of 50 to 500 sccm to the first container 24 so that bubbled 1,1,1,3,3-pentafluoropropene is introduced into the reaction chamber 11. After the pressure inside the reaction chamber 11 is set to 100 to 500 mTorr, RW power of 100 to 500 W at a frequency of 13.56 MHz is applied from the second RF power source 17 to the shower head 16 serving as the upper electrode. During the process, 1,1,1,3,3-pentafluoropropene gas is partially decomposed to generate monomers, ions, and radicals as decomposition products, which are polymerized to form the interlayer insulating film made of the plasma polymerization film on the semiconductor substrate 12.

Since the plasma polymerization film contains 1,1,1,3,3-pentafluoropropene as a main component, the interlayer insulating film composed thereof was a fluorinated amorphous carbon film containing a carbon atom, a fluorine atom, and a hydrogen atom. The fluorinated amorphous carbon film had a dielectric constant of 2.5 immediately after deposition.

Since the plasma polymerization film is formed from ions and radicals which are decomposition products resulting from the decomposition of the gas in the plasma and have reacted on the semiconductor substrate 12, the properties of the decomposition products present in the plasma deeply influence the structure of the plasma polymerization film. Moreover, the heat resistance of the plasma polymerization film is closely related to the crosslinking density thereof, which determines the structure of the plasma polymerization film.

In a conventional plasma polymerization film composed of a fluorinated amorphous carbon film, bonding in polymer composing the plasma polymerization film is linear and one-dimensional so that the glass transition temperature thereof is low, which may account for poor heat resistance.

In the interlayer insulating film according to the second embodiment, by contrast, bonding in polymer composing the plasma polymerization film tends to be three-dimensional, so that the crosslinking density and glass transition temperature thereof become high, resulting in excellent heat resistance. Specifically, since 1,1,1,3,3-pentafluoropropene has a double bond of carbon atoms in a molecule thereof, decomposition products resulting from the decomposition of 1,1,1,3,3-pentafluoropropene in the plasma are likely to undergo a crosslinking reaction during the formation of the plasma polymerization film on the semiconductor substrate 12. Accordingly, the resulting plasma polymerization film has a high glass transition temperature and excellent heat resistance.

To evaluate the heat resistance of the interlayer insulating film according to the second embodiment, the semiconductor substrate 12 formed with the fluorinated amorphous carbon film according to the second embodiment was held at a temperature of 400° C. in vacuum for 1 hour. The thickness and dielectric constant of the fluorinated amorphous carbon film were then measured, with the result that a reduction in film thickness was only about 6% and an increase in dielectric constant, which was measured to be about 2.6, was only 0.1. This has proved the excellent heat resistance of the fluorinated amorphous carbon film according to the second embodiment.

Although the second embodiment has used 1,1,1,3,3-pentafluoropropene as the fluorinated carbon compound having a double bond of carbon atoms in a molecule thereof and containing a hydrogen atom, it is also possible to use 1H,1H,2H-perfluorohexen, 1H,1H,2H-perfluoro-1-octene, trifluoroethylene, or 3,3,3-trifluoropropene instead.

Although the second embodiment has used the fluorinated carbon compound having a double bond of carbon atoms in a molecule thereof and containing a hydrogen atom, it may also contain another component such as $N_2$.

(Third Embodiment)

An interlayer insulating film according to a third embodiment is a fluorinated amorphous carbon film formed by inducing plasma polymerization of a material having, as a main component, hexafluoropropene which is a fluorinated carbon compound having a double bond of carbon atoms in a molecule thereof and containing no hydrogen atom.

Since the third embodiment has been implemented by replacing the material used in the second embodiment, a description will be given only to the material.

When hexafluoropropene is introduced into the reaction chamber 11, it is partially decomposed and changed into a plasma, while monomers, ions, and radicals are generated as decomposition products and polymerized to form the interlayer insulating film composed of the plasma polymerization film on the semiconductor substrate 12.

Since hexafluoropropene according to the third embodiment contains no hydrogen atom, the resulting interlayer insulating film was a fluorinated amorphous carbon film containing only carbon and fluorine atoms. The fluorinated amorphous carbon film had a dielectric constant of 2.3 immediately after deposition.

Since bonding in polymer composing the plasma polymerization film also tends to be three-dimensional in the third embodiment, the film has a high glass transition temperature and excellent heat resistance.

To evaluate the heat resistance of the interlayer insulating film according to the third embodiment, the semiconductor substrate 12 formed with the fluorinated amorphous carbon film according to the third embodiment was held at a temperature of 400° C. in vacuum for 1 hour. The thickness and dielectric constant of the fluorinated amorphous carbon film were then measured, with the result that a reduction in film thickness was only about 5% and an increase in dielectric constant, which was measured to be about 2.5, was only 0.2. This has proved the excellent heat resistance of the fluorinated amorphous carbon film according to the third embodiment. Since the fluorinated amorphous carbon film according to the third embodiment contains no hydrogen atom and is composed only of a fluorinated carbon, it has higher heat resistance and a lower dielectric constant than the fluorinated amorphous carbon film according to the second embodiment.

Although the third embodiment has used the fluorinated carbon compound having a double bond of carbon atoms in a molecule thereof and containing no hydrogen atom, it may also contain another component such as $N_2$.

(Fourth Embodiment)

An interlayer insulating film according to a fourth embodiment is a fluorinated amorphous carbon film formed by inducing plasma polymerization of a material having, as a main component, hexafluoro-1,3-butadiene which is a fluorinated compound having two double bonds of carbon atoms in a molecule thereof and containing no hydrogen atom.

Since the fourth embodiment has been implemented by replacing the material used in the second embodiment, a description will be given only to the material. When hexafluoro-1,3-butadiene represented by the following Chemical Formula 3 is introduced into the reaction chamber 11, it is partially decomposed to generate monomers, ions, and radicals as decomposition products, which are polymerized to form the interlayer insulating film composed of the plasma polymerization film on the semiconductor substrate 12:

Chemical Formula 3

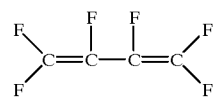

In the fourth embodiment, since hexafluoro-1,3-butadiene has two double bonds of carbon atoms in a molecule thereof, the two double bonds partially decomposed in a plasma generate radicals each having four unoccupied bonds, as shown by the following Chemical Formula 4, which undergo polymerization:

Chemical Formula 4

As a consequence, bonding in polymer composing the plasma polymerization film positively becomes three-dimensional, so that the crosslinking density and glass transition temperature of the resulting interlayer insulating film become higher than in the second and third embodiments, resulting in improved heat resistance.

Although the fourth embodiment has used the fluorinated carbon compound having two double bonds of carbon atoms in a molecule thereof and containing no hydrogen atom, it may also contain another component such as $N_2$.

(Fifth Embodiment)

An interlayer insulating film according to a fifth embodiment is a fluorinated amorphous carbon film formed by inducing plasma polymerization of a material having, as a main component, 3,3,3-trifluoropropyne which is a fluorinated carbon compound having a triple bond of carbon atoms in a molecule thereof and containing a hydrogen atom.

Since the fifth embodiment has been implemented by replacing the material used in the second embodiment, a description will be given only to the material.

When 3,3,3-trifluoropropyne ($CF_3C\equiv CH$) is introduced into the reaction chamber 11, it is partially decomposed to generate monomers, ions, and radicals as decomposition products, which are polymerized to form the interlayer insulating film composed of the plasma polymerization film on the semiconductor substrate 12.

In the fifth embodiment, since 3,3,3-trifluoropropyne contains a hydrogen atom, the resulting interlayer insulating film is a fluorinated amorphous carbon film containing a hydrogen atom as well as carbon and fluorine atoms. The fluorinated amorphous carbon film had a dielectric constant of 2.5 immediately after deposition.

In the fifth embodiment, since 3,3,3-trifluoropropyne has a triple bond of carbon atoms in a molecule thereof, as shown by the following Chemical Formula 5, the triple bond partially decomposed in the plasma generate radicals each having four unoccupied bonds, as shown in the following Chemical Formula 6, which undergo polymerization:

Chemical Formula 5

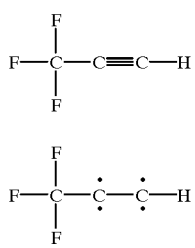

Chemical Formula 6

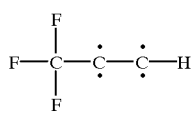

As a consequence, bonding in polymer composing the plasma polymerization film positively becomes three-dimensional, so that the crosslinking density and glass transition temperature of the resulting interlayer insulating film become higher than in the second and third embodiments, resulting in improved heat resistance.

To evaluate the heat resistance of the interlayer insulating film according to the fifth embodiment, the semiconductor substrate 12 formed with the fluorinated amorphous carbon film according to the fifth embodiment was held at a temperature of 400° C. in vacuum for 1 hour. The thickness and dielectric constant of the fluorinated amorphous carbon film were then measured, with the result that a reduction in film thickness was only about 5% and an increase in dielectric constant, which was measured to be about 2.6, was only 0.1. This has proved the excellent heat resistance of the fluorinated amorphous carbon film according to the fifth embodiment.

Although the fifth embodiment has used 3,3,3-trifluoropropyne as the fluorinated carbon compound having a triple bond of carbon atoms in a molecule thereof and containing a hydrogen atom, perfluoro(t-butyl)acetylene (HC≡CC(CF$_3$)$_3$) may be used instead.

Although the fifth embodiment has used the fluorinated carbon compound having a triple bond of carbon atoms in a molecule thereof and containing a hydrogen atom, it may also contain another component such as N$_2$.

(Sixth Embodiment)

An interlayer insulating film according to a sixth embodiment is a fluorinated amorphous carbon film formed by inducing plasma polymerization of a material having, as a main component, hexafluoro-2-butyne which is a fluorinated carbon compound having a triple bond of carbon atoms in a molecule thereof and containing no hydrogen atom.

Since the sixth embodiment has been implemented by replacing the material used in the second embodiment, a description will be given only to the material.

When hexafluoro-2-butyne (CF$_3$C≡CCF$_3$) is introduced into the reaction chamber 11, it is partially decomposed to generate monomers, ions, and radicals as decomposition products, which are polymerized to form the interlayer insulating film composed of the plasma polymerization film on the semiconductor substrate 12.

In the sixth embodiment, since hexafluoro-2-butyne contains no hydrogen atom, the resulting interlayer insulating film is a fluorinated amorphous carbon film containing only carbon and fluorine atoms. The fluorinated amorphous carbon film had a dielectric constant of 2.3 immediately after deposition.

In the sixth embodiment, since hexafluoro-2-butyne has a triple bond of carbon atoms in a molecule thereof, similarly to 3,3,3-trifluoropropyne represented by the foregoing Chemical Formula 5, the triple bond partially decomposed in a plasma generate radicals each having four unoccupied bonds, similarly to the case of 3,3,3-trifluoropropyne, which undergo polymerization. As a consequence, bonding in polymer composing the plasma polymerization film positively becomes three-dimensional, so that the crosslinking density and glass transition temperature of the resulting interlayer insulating film become higher than in the second and third embodiments, resulting in improved heat resistance.

To evaluate the heat resistance of the interlayer insulating film according to the sixth embodiment, the semiconductor substrate 12 formed with the fluorinated amorphous carbon film according to the sixth embodiment was held at a temperature of 400° C. in vacuum for 1 hour. The thickness and dielectric constant of the fluorinated amorphous carbon film were then measured, with the result that a reduction in film thickness was only about 5% and an increase in dielectric constant, which was measured to be about 2.4, was only 0.1. This has proved the excellent heat resistance of the fluorinated amorphous carbon film according to the sixth embodiment.

Although the fifth embodiment has used the fluorinated carbon compound having a triple bond of carbon atoms in a molecule thereof and containing no hydrogen atom, it may also contain another component such as N$_2$.

(Seventh Embodiment)

An interlayer insulating film according to a seventh embodiment is a fluorinated amorphous carbon film formed by inducing plasma polymerization of a material having, as a main component, perfluorodecalin which is a fluorinated carbon compound having a polycyclic structure (condensed cyclic structure) in a molecule thereof and containing no hydrogen atom.

Since the seventh embodiment has been implemented by replacing the material used in the second embodiment, a description will be given only to the material.

When perfluorodecalin represented by the following Chemical Formula 7 is introduced into the reaction chamber 11, it is partially decomposed to generate monomers, ions, and radicals as decomposition products, which are polymerized to form the interlayer insulating film made of the plasma polymerization film on the semiconductor substrate 12:

Chemical Formula 7

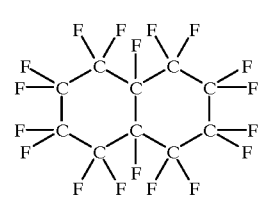

In the seventh embodiment, since perfluorodecalin contains no hydrogen atom, the resulting interlayer insulating film is a fluorinated amorphous carbon film containing only carbon and fluorine atoms. The fluorinated amorphous carbon film had a dielectric constant of 2.3 immediately after deposition.

In the seventh embodiment, since perfluorodecalin has a polycyclic structure (condensed structure) in a molecule thereof, as shown by the foregoing Chemical Formula 7, the polycyclic structure partially decomposed in a plasma generate radicals each having four unoccupied bonds, as shown in the following Chemical Formula 8, which undergo polymerization:

Chemical Formula 8

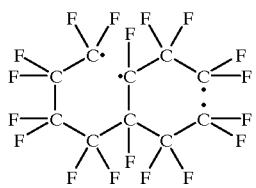

As a consequence, bonding in polymer composing the plasma polymerization film positively becomes three-dimensional, so that the crosslinking density and glass transition temperature of the resulting interlayer insulating film become higher than in the second and third embodiments, resulting in improved heat resistance.

To evaluate the heat resistance of the interlayer insulating film according to the seventh embodiment, the semiconductor substrate 12 formed with the fluorinated amorphous carbon film according to the seventh embodiment was held at a temperature of 400° C. in vacuum for 1 hour. The thickness and dielectric constant of the fluorinated amorphous carbon film were then measured, with the result that a reduction in film thickness was only about 5% and an increase in dielectric constant, which was measured to be about 2.4, was only 0.1. This has proved the excellent heat resistance of the fluorinated amorphous carbon film according to the seventh embodiment.

Although the seventh embodiment has used perfluorodecalin as the fluorinated carbon compound having a polycyclic structure in a molecule thereof and containing no hydrogen atom, a fluorinated carbon compound having a condensed cyclic structure such as perfluorofluorene represented by the following Chemical Formula 9, perfluoro-1-methyldecalin represented by the following Chemical Formula 10, or perfluoro(tetradecahydrophenanthrene) represented by the following Chemical Formula 11 may be used instead:

Chemical Formula 9

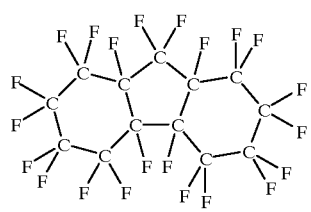

Chemical Formula 10

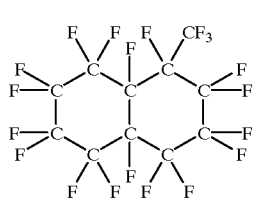

Chemical Formula 11

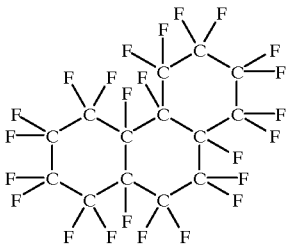

Alternatively, it is also possible to use a fluorinated carbon compound having a normal polycyclic structure such as perfluorobiphenyl represented by the following Chemical Formula 12:

Chemical Formula 12

(Eighth Embodiment)

An interlayer insulating film according to an eighth embodiment is a silicon oxide film containing a fluorinated carbon formed by inducing plasma polymerization of a material containing, as a main component, a gas mixture of phenyltrimethoxysilane which is an organic silicon compound represented by the following general formula:

$R^1_x Si(OR^2)_{4-x}$ (where $R^1$ is a phenyl group or a vinyl group; $R^2$ is an alkyl group; and x is an integer of 1 to 3) and a benzene derivative having a F—C bond which is a fluorinated carbon compound.

A description will be given to a method of forming the interlayer insulating film according to the eighth embodiment.

First, the semiconductor substrate 12 is placed on the sample stage 13 heated to, e.g., 400° C. and grounded by the change-over switch 14 and then the reaction chamber 11 is evacuated by the vacuum pump 26.

Next, carrier gas composed of, e.g., argon is supplied at a flow rate of 200 cc/min to the first container 24 containing therein phenyltrimethoxysilane represented by the foregoing Chemical Formula 1, so that bubbled phenyltrimethoxysilane is introduced into the reaction chamber 11. Meanwhile, carrier gas composed of, e.g., argon is supplied at a flow rate of 200 cc/min to the second container 25 containing therein difluorobenzene which is a benzene derivative having a F—C bond represented by the following Chemical Formula 13 so that bubbled difluorobenzene is introduced into the reaction chamber 11:

Chemical Formula 13

Next, the pressure inside the reaction chamber 11 is set to about 1.0 Torr and RF power of 600 W at a frequency of 13.56 MHz is applied from the second RF power source 17 to the shower head 16 serving as the upper electrode. During the process, phenyltrimethoxysilane gas and difluorobenzene are partially decomposed to generate monomers, ions, and radicals as decomposition products, which are polymerized to form the interlayer insulating film composed of the plasma polymerization film on the semiconductor substrate 12. The structure of the plasma polymerization film is diagrammatically shown by the following Chemical Formula 14:

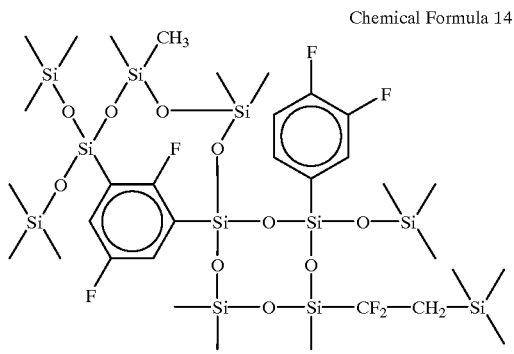

Chemical Formula 14

Since the interlayer insulating film according to the eighth embodiment is formed by plasma CVD, it is unnecessary to repeatedly perform the steps of applying the organic SOG agent and thermally curing the applied SOG agent several times, resulting in improved film formability and lower cost.

The dielectric constant of the interlayer insulating film according to the eighth embodiment was as low as about 2.5. After the interlayer insulating film was allowed to stand at room temperature for about 2 weeks, the dielectric constant thereof was measured again to be about 2.7, which indicates stable film quality scarcely varying with time. Thus, according to the eighth embodiment, there can be formed the interlayer insulating film with improved film formability and a reduced dielectric constant.

The density of leakage currents was also measured to be about $4.5 \times 10^{-8}$ A/cm$^2$ at 5 MV/cm, which was satisfactory.

Although the pressure inside the reaction chamber 11 has been set to about 1.0 Torr, it is not limited thereto but may be set at any value within the range of 100 mTorr to 20 Torr. More preferably, the pressure inside the reaction chamber 11 is within the range of 0.5 to 5.0 Torr.

The RF power applied to the shower head 16 as the upper electrode may have any value within the range of 100 to 1000 W. More preferably, the RF power has a value within the range of 250 to 500 W.

Although the semiconductor substrate 12 may be heated to any temperature within the range of 25 to 500° C., similarly to the first embodiment, it is preferably heated to a temperature within the range of 200 to 400° C.

As compounds represented by the foregoing general formula: $R^1_x Si(OR^2)_{4-x}$ where $R^1$ is a phenyl group, there can be listed diphenyldimethoxysilane in addition to phenyltrimethoxysilane. As compounds represented by the foregoing general formula: $R^1_x Si(OR^2)_{4-x}$ where $R^1$ is a vinyl group, there can be listed vinyltrimethoxysilane and divinyldimethoxysilane.

As the benzene derivative having a F—C bond which is a fluorinated carbon compound, benzene fluoride such as fluorobenzene or hexafluorobenzene may be used instead of difluorobenzene.

(Ninth Embodiment)

An interlayer insulating film according to a ninth embodiment is a silicon oxide film containing a fluorinated carbon formed by inducing plasma polymerization of a material containing, as a main component, a gas mixture of phenyltrimethoxysilane which is an organic silicon compound represented by the following general formula:

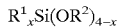

$R^1_x Si(OR^2)_{4-x}$ (where $R^1$ is a phenyl group or a vinyl group; $R^2$ is an alkyl group; and x is an integer of 1 to 3) and $C_2F_6$ which is a fluorinated carbon compound.

A description will be given to a method of forming the interlayer insulating film according to the ninth embodiment.

First, the semiconductor substrate 12 is placed on the sample stage 13 heated to, e.g., 400° C. and grounded by the change-over switch 14 and then the reaction chamber 11 is evacuated by the vacuum pump 26.

Next, carrier gas composed of, e.g., argon is supplied at a flow rate of 200 cc/min to the first container 24 containing therein phenyltrimethoxysilane so that bubbled phenyltrimethoxysilane is introduced into the reaction chamber 11, while $C_2F_6$ gas is introduced into the reaction chamber 11 through the third gas supply line 23.

Next, the pressure inside the reaction chamber 11 is set to about 1.0 Torr and RF power of 700 W at a frequency of 13.56 MHz is applied from the second RF power source 17 to the shower head 16 serving as the upper electrode. During the process, phenyltrimethoxysilane gas and $C_2F_6$ are partially decomposed to generate monomers, ions, and radicals as decomposition products, which are polymerized to form the interlayer insulating film composed of the plasma polymerization film on the semiconductor substrate 12. The structure of the plasma polymerization film is diagrammatically shown by the following Chemical Formula 15:

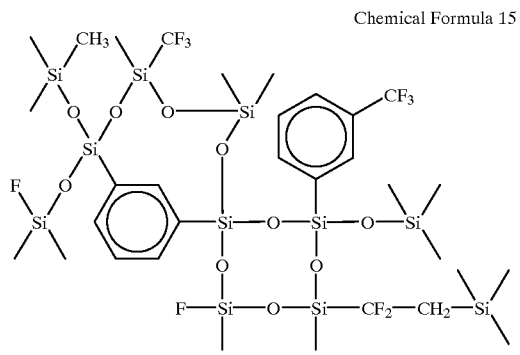

Chemical Formula 15

Since the interlayer insulating film according to the ninth embodiment is formed by plasma CVD, it is unnecessary to repeatedly perform the steps of applying the organic SOG agent and thermally curing the applied SOG agent several times, resulting in improved film formability and lower cost.

The dielectric constant of the interlayer insulating film according to the ninth embodiment was as low as about 2.9. After the interlayer insulating film was allowed to stand at room temperature for about 2 weeks, the dielectric constant thereof was measured again to be about 3.0, which indicates stable film quality scarcely varying with time. Thus, according to the ninth embodiment, there can be formed the interlayer insulating film with improved film formability and a reduced dielectric constant.

The density of leakage currents was also measured to be about $5.5 \times 10^{-8}$ A/cm$^2$ at 5 MV/cm, which was satisfactory.

Although the pressure inside the reaction chamber 11 has been set to about 1.0 Torr, it is not limited thereto but may be set at any value within the range of 100 mTorr to 20 Torr. More preferably, the pressure inside the reaction chamber 11 is within the range of 0.5 to 5.0 Torr.

The RF power applied to the shower head 16 as the upper electrode may have any value within the range of 100 to 2000 W. More preferably, the RF power has a value within the range of 300 to 750 W.

Although the semiconductor substrate 12 may be heated to any temperature within the range of 25 to 500° C., it is preferably heated to a temperature within the range of 200 to 400° C.

As compounds represented by the foregoing general formula: $R^1_x Si(OR^2)_{4-x}$ where $R^1$ is a phenyl group, there can be listed diphenyldimethoxysilane in addition to phenyltrimethoxysilane. As compounds represented by the foregoing general formula: $R^1_x Si(OR^2)_{4-x}$ where $R^1$ is a vinyl group, there can be listed vinyltrimethoxysilane and divinyldimethoxysilane.

As the fluorinated carbon compound, $CF_4$, $C_4F_8$, or the like may be used instead of $C_2F_6$.

Although the ninth embodiment has formed the interlayer insulating film composed of the plasma polymerization film by causing the material having, as a main component, an organic silicon compound represented by the general formula $R^1_x Si(OR^2)_{4-x}$ to undergo plasma polymerization, the interlayer insulating film may also be formed by causing the material having, as a main component, an organic silicon compound represented by the following general formula:

$$R^1_x SiH_{4-x}$$

(where $R^1$ is a phenyl group or a vinyl group; and x is an integer of 1 to 3) to undergo plasma polymerization or by causing the material having, as a main component, an organic silicon compound represented by the foregoing general formula:

$$R^1_x Si(OR^2)_{4-x}$$

or by the foregoing general formula:

$$R^1_x SiH_{4-x}$$

to react with an oxidizing agent made of, e.g., $O_2$ or $H_2O$. In this case, $O_2$ gas or $H_2O$ gas as well as $C_2F_6$ gas is introduced into the reaction chamber 11 through the third gas supply line 23.

As compounds represented by the foregoing general formula: $R^1_x SiH_{4-x}$ where $R^1$ is a phenyl group, there may be listed phenylsilane and diphenylsilane. As compounds represented by the foregoing general formula: $R^1_x SiH_{4-x}$ where $R^1$ is a vinyl group, there may be listed vinylsilane or divinylsilane.

(Tenth Embodiment)

An interlayer insulating film according to a tenth embodiment is a silicon oxide film containing a fluorinated carbon formed by inducing plasma polymerization of a material containing, as a main component, a gas mixture of phenyltrimethoxysilane which is an organic silicon compound represented by the following general formula:

$$R^1_x Si(OR^2)_{4-x}$$

(where $R^1$ is a phenyl group or a vinyl group; $R^2$ is an alkyl group; and x is an integer of 1 to 3) and perfluorodecalin which is the fluorinated carbon compound represented by the foregoing Chemical Formula 7.

A description will be given to a method of forming the interlayer insulating film according to the tenth embodiment.

First, the semiconductor substrate 12 is placed on the sample stage 13 heated to, e.g., 400° C. and grounded by the change-over switch 14 and then the reaction chamber 11 is evacuated by the vacuum pump 26.

Next, carrier gas composed of, e.g., argon is supplied at a flow rate of 280 cc/min to the first container 24 containing therein phenyltrimethoxysilane so that bubbled phenyltrimethoxysilane is introduced into the reaction chamber 11. Meanwhile, carrier gas composed of, e.g., argon is supplied at a flow rate of 42 cc/min to the second container 25 containing therein perfluorodecalin so that bubbled perfluorodecalin is introduced into the reaction chamber 11.

Next, the pressure inside the reaction chamber 11 is set to about 2.0 Torr and RF power of 500 W at a frequency of 13.56 MHz is applied from the second RF power source 17 to the shower head 16 serving as the upper electrode. During the process, phenyltrimethoxysilane gas and perfluorodecalin are partially decomposed to generate monomers, ions, and radicals as decomposition products, which are polymerized to form the interlayer insulating film made of the plasma polymerization film on the semiconductor substrate 12.

Since the interlayer insulating film according to the tenth embodiment is formed by plasma CVD, it is unnecessary to repeatedly perform the steps of applying the organic SOG agent and thermally curing the applied SOG agent several times, resulting in improved film formability and lower cost.

The dielectric constant of the interlayer insulating film according to the tenth embodiment was as low as about 2.6. After the interlayer insulating film was allowed to stand at room temperature for about 2 weeks, the dielectric constant thereof was measured again to be about 2.7, which indicates stable film quality scarcely varying with time. Thus, according to the tenth embodiment, there can be formed the interlayer insulating film with improved film formability and a reduced dielectric constant.

Moreover, the interlayer insulating film had a glass transition temperature of 430° C. or more, which indicates excellent heat resistance.

Although the pressure inside the reaction chamber 11 has been set to about 1.0 Torr, it is not limited thereto but may be set at any value within the range of 100 mTorr to 20 Torr. More preferably, the pressure inside the reaction chamber 11 is within the range of 0.5 to 5.0 Torr.

The RF power applied to the shower head 16 as the upper electrode may have any value within the range of 100 to 1000 W. More preferably, the RF power has a value within the range of 250 to 500 W.

Although the semiconductor substrate 12 may be heated to any temperature within the range of 25 to 500° C., similarly to the first embodiment, it is preferably heated to a temperature within the range of 200 to 400° C.

As compounds represented by the foregoing general formula: $R^1_x Si(OR^2)_{4-x}$ where $R^1$ is a phenyl group, there may be listed diphenyldimethoxysilane in addition to phenyltrimethoxysilane. As compounds represented by the foregoing general formula: $R^1_x Si(OR^2)_{4-x}$ where $R^1$ is a vinyl group, there may be listed vinyltrimethoxysilane and divinyldimethoxysilane.

The fluorinated carbon compound is not limited to perfluorodecalin but those shown in the second to seventh embodiments may be used properly.

(Eleventh Embodiment)

An interlayer insulating film according to an eleventh embodiment is a silicon oxide film containing a fluorinated carbon formed by inducing plasma polymerization of a material containing, as a main component, a gas mixture of hexamethyldisiloxane which is a siloxane derivative and perfluorodecalin which is the fluorinated carbon compound represented by the foregoing Chemical Formula 7.

A description will be given to a method of forming the interlayer insulating film according to the eleventh embodiment.

First, the semiconductor substrate 12 is placed on the sample stage 13 heated to, e.g., 400° C. and grounded by the change-over switch 14 and then the reaction chamber 11 is evacuated by the vacuum pump 26.

Next, carrier gas composed of, e.g., argon is supplied at a flow rate of 28 cc/min to the first container 24 containing therein hexamethyldisiloxane so that bubbled hexamethyldisiloxane is introduced into the reaction chamber 11. Meanwhile, carrier gas composed of, e.g., argon is supplied at a flow rate of 280 cc/min to the second container 25 containing therein perfluorodecalin so that bubbled perfluorodecalin is introduced into the reaction chamber 11.

Next, the pressure inside the reaction chamber 11 is set to about 0.8 Torr and RF power of 250 W at a frequency of 13.56 MHz is applied from the second RF power source 17 to the shower head 16 serving as the upper electrode. During the process, hexamethyldisiloxane and perfluorodecalin are partially decomposed to generate monomers, ions, and radicals as decomposition products, which are polymerized to form the interlayer insulating film composed of the plasma polymerization film on the semiconductor substrate 12.

Since the interlayer insulating film according to the eleventh embodiment is formed by plasma CVD, it is unnecessary to repeatedly perform the steps of applying the organic SOG agent and thermally curing the applied SOG agent several times, resulting in improved film formability and lower cost.

The dielectric constant of the interlayer insulating film according to the eleventh embodiment was as low as about 2.75. After the interlayer insulating film was allowed to stand at room temperature for about 2 weeks, the dielectric constant thereof was measured again to be about 2.8, which indicates stable film quality scarcely varying with time. Thus, according to the eleventh embodiment, there can be formed the interlayer insulating film with improved film formability and a reduced dielectric constant.

Moreover, the interlayer insulating film had a glass transition temperature of 430° C. or more, which indicates excellent heat resistance.

Although the pressure inside the reaction chamber 11 has been set to about 0.8 Torr, it is not limited thereto but may be set at any value within the range of 100 mTorr to 20 Torr. More preferably, the pressure inside the reaction chamber 11 is within the range of 0.5 to 5.0 Torr.

The RF power applied to the shower head 16 as the upper electrode may have any value within the range of 100 to 1000 W. More preferably, the RF power has a value within the range of 250 to 500 W.

Although the semiconductor substrate 12 may be heated to any temperature within the range of 25 to 500° C., similarly to the first embodiment, it is preferably heated to a temperature within the range of 200 to 400° C.

As the siloxane derivative, 1,1,3,3-tetramethyldisiloxane ($H(CH_3)_2Si-O-Si(CH_3)_2H$, 1,3,5,7-tetramethylcyclotetrasiloxane represented by the following Chemical Formula 16, or the like may be used instead of hexamethyldisiloxane:

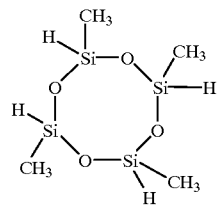

Chemical Formula 16

The fluorinated carbon compound is not limited to perfluorodecalin but those shown in the second to seventh embodiments may be used properly.

Although the eleventh embodiment has formed the interlayer insulating film composed of the plasma polymerization film by causing the material having the siloxane derivative as the main component to undergo plasma polymerization, the interlayer insulating film may also be formed by causing the material having the siloxane derivative as the main component to react with an oxidizing agent made of, e.g., $O_2$ or $H_2O$. In this case, $O_2$ gas, $H_2O$ gas, or the like is introduced into the reaction chamber 11 through the third gas supply line 23.

Although the argon gas has been used as the carrier gas in each of the first to eleventh embodiments, hydrogen, nitrogen, or helium may also be used properly instead of the argon gas.

Although the sample stage 13 as the lower electrode has been grounded in each of the first to eleventh embodiments, if the RF power is applied from the first RF power source 15 to the sample stage 13 by using the change-over switch 14, a plasma composed of a reactive gas generated in the reaction chamber 11 can be supplied efficiently to the sample stage 13, so that the speed at which the interlayer insulating film is formed is increased about two- to five-fold.

We claim:

1. A method of forming an interlayer insulating film, wherein a material containing, as a main component, an organic silicon compound represented by the following general formula:

$$R^1_xSi(OR^2)_{4-x}$$

(where $R^1$ is a phenyl group or a vinyl group; $R^2$ is an alkyl group; and x is an integer of 1 to 3) is caused to undergo plasma polymerization or react with an oxidizing agent to form an interlayer insulating film which is composed of a silicon oxide film containing an organic component and has a structure in which constituents are not regularly arranged.

2. A method of forming an interlayer insulating film according to claim 1, wherein said organic silicon compound is phenyltrimethoxysilane or diphenyldimethoxysilane.

3. A method of forming an interlayer insulating film according to claim 1, wherein said organic silicon compound is vinyltrimethoxysilane or divinyldimethoxysilane.

4. A method of forming an interlayer insulating film, wherein a material containing, as a main component, an organic silicon compound represented by the following general formula:

$$R^1_xSiH_{4-x}$$

(where $R^1$ is a phenyl group or a vinyl group; and x is an integer of 1 to 3) is caused to undergo plasma polymerization or react with an oxidizing agent to form an interlayer insulating film which is composed of a silicon oxide film containing an organic component and has a structure in which constituents are not regularly arranged.

5. A method of forming an interlayer insulating film according to claim 4, wherein said organic silicon compound is phenylsilane or diphenylsilane.

6. A method of forming an interlayer insulating film according to claim 4, wherein said organic silicon compound is vinylsilane or divinylsilane.

7. A method of forming an interlayer insulating film, wherein a material containing, as a main component, an organic silicon compound represented by the following general formula:

$$R^1{}_x Si(OR^2)_{4-x}$$

(where $R^1$ is a phenyl group or a vinyl group; $R^2$ is an alkyl group; and x is an integer of 1 to 3) is caused to undergo plasma polymerization by means of plasma chemical vapor deposition to form an interlayer insulating film which is composed of a silicon oxide film containing an organic component and has a structure in which constituents are not regularly arranged.

8. A method of forming an interlayer insulating film, wherein a material containing, as a main component, an organic silicon compound represented by the following general formula:

$$R^1{}_x SiH_{4-x}$$

(where $R^1$ is a phenyl group or a vinyl group; and x is an integer of 1 to 3) is caused to undergo plasma polymerization by means of plasma chemical vapor deposition to form an interlayer insulating film which is composed of a silicon oxide film containing an organic component and has a structure in which constituents are not regularly arranged.

* * * * *